(12) United States Patent
Brandl (10) Patent No.: US 12,278,194 B2
(45) Date of Patent: Apr. 15, 2025

(54) OPTOELECTRONIC COMPONENT WITH TWO-DIMENSIONAL CODE ON ITS SURFACE, SYSTEM AND METHOD FOR PRODUCING SAME

(71) Applicant: OSRAM Opto Semiconductors GmbH, Regensburg (DE)

(72) Inventor: Michael Brandl, Mintraching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 766 days.

(21) Appl. No.: 17/602,051

(22) PCT Filed: Apr. 8, 2020

(86) PCT No.: PCT/EP2020/060032
§ 371 (c)(1),
(2) Date: Oct. 7, 2021

(87) PCT Pub. No.: WO2020/208080
PCT Pub. Date: Oct. 15, 2020

(65) Prior Publication Data
US 2022/0181266 A1      Jun. 9, 2022

(30) Foreign Application Priority Data

Apr. 9, 2019   (DE) ..................... 10 2019 109 329.5

(51) Int. Cl.
*H01L 27/15* (2006.01)
*H01L 23/544* (2006.01)
(Continued)

(52) U.S. Cl.
CPC .......... *H01L 23/544* (2013.01); *H01L 25/167* (2013.01); *H10H 20/857* (2025.01);
(Continued)

(58) Field of Classification Search
CPC ..... H01L 23/544; H01L 25/167; H01L 33/62; H01L 2223/54413; H01L 2223/54446;
(Continued)

(56) References Cited

U.S. PATENT DOCUMENTS

2008/0224155 A1  9/2008 Fukasawa et al.
2012/0074438 A1  3/2012 Iwang et al.
(Continued)

OTHER PUBLICATIONS

International Search Report issued for corresponding International Patent Application No. PCT/EP2020/060032 on Jun. 18, 2020, along with an English translation.

(Continued)

*Primary Examiner* — Ismail A Muse
(74) *Attorney, Agent, or Firm* — Hauptman Ham, LLP (57) ABSTRACT

An optoelectronic component includes at least one optoelectronic semiconductor chip and an electronic first storage medium. The first storage medium electrically stores first component information. The component can be uniquely identified via the first component information. The optoelectronic component also includes a second storage medium which can be read out wirelessly at least in an unmounted state of the component. The second storage medium stores second component information that is representative of the first component information.

13 Claims, 9 Drawing Sheets (51) Int. Cl.
　　*H01L 25/16*　　(2023.01)
　　*H01L 29/267*　　(2006.01)
　　*H01L 31/12*　　(2006.01)
　　*H01L 33/00*　　(2010.01)
　　*H10H 20/857*　　(2025.01)
(52) U.S. Cl.
　　CPC .............. *H01L 2223/54413* (2013.01); *H01L 2223/54446* (2013.01); *H01L 2223/54486* (2013.01)
(58) Field of Classification Search
　　CPC ....... H01L 2223/54486; H01L 33/0095; H01L 2223/54433; H01L 2223/5444; H01L 25/075–0756; H01L 25/13; H01L 25/16–167; H01L 25/18; H10H 29/8506; H10K 50/844–8445; H10K 50/841–8428; H10K 25/048; H10K 59/90–95
　　See application file for complete search history.

(56) References Cited

U.S. PATENT DOCUMENTS

| | | | |
|---|---|---|---|
| 2015/0130349 A1* | 5/2015 | McWithey | B60Q 1/0088 315/82 |
| 2017/0089537 A1* | 3/2017 | Tsuchiya | F21V 5/007 |
| 2019/0049512 A1* | 2/2019 | Low | G01R 1/0416 |
| 2019/0235644 A1* | 8/2019 | Chen | G06F 3/011 |
| 2021/0365923 A1* | 11/2021 | Mehra | G06Q 20/3276 |
| 2022/0108594 A1* | 4/2022 | Farley | G08B 21/02 |

OTHER PUBLICATIONS

Written Opinion issued for corresponding International Patent Application No. PCT/EP2020/060032 on Jun. 18, 2020.

\* cited by examiner

OPTOELECTRONIC COMPONENT WITH TWO-DIMENSIONAL CODE ON ITS SURFACE, SYSTEM AND METHOD FOR PRODUCING SAME

CROSS REFERENCE TO RELATED APPLICATION

This application is a National Stage of International Application No. PCT/EP2020/060032, filed on Apr. 8, 2020, which designates the U.S. and was published in Europe, and which claims priority to German Patent Application No. 10 2019 109 329.5, filed on Apr. 9, 2019 in the German Patent Office. Both of the aforementioned applications are hereby incorporated by reference in their entireties.

An optoelectronic component, a system, a method for producing an optoelectronic component, a method for producing a system, and a method for controlling a system are specified.

An object to be solved is to specify an optoelectronic component which can be quickly and easily identified electronically and which can be controlled in a simple manner. Another object to be solved is to specify a system with a plurality of such optoelectronic components. An object to be solved is to specify a method for producing such a component and such a system. Furthermore, an object to be solved is to specify a method for controlling such a system.

First, an optoelectronic component is specified. The optoelectronic component is in particular a light-emitting diode, LED for short. In intended operation, the optoelectronic component preferably emits radiation in the visible spectral range or in the UV range or in the IR range.

According to at least one embodiment, the optoelectronic component comprises at least one optoelectronic semiconductor chip and an electronic, first storage medium.

An optoelectronic semiconductor chip is understood here and in the following as an element that can be separately handled and electrically contacted. A semiconductor chip is formed in particular by separation from a wafer composite. In particular, side surfaces of such a semiconductor chip comprise, for example, traces from the separation process of the wafer composite. An optoelectronic semiconductor chip preferably comprises exactly one originally contiguous region of the semiconductor layer sequence grown in the wafer composite. The semiconductor layer sequence of the semiconductor chip is preferably formed contiguous. The lateral extent of the semiconductor chip, measured parallel to the main extension direction of the active layer, is, for example, at most 1% or at most 5% or at most 10% larger than the lateral extent of the active layer or the semiconductor layer sequence.

The semiconductor layer sequence of the semiconductor chip is based, for example, on a III-V compound semiconductor material, in particular on AlGaInN or InGaAlP or InGaN, or on GaS. The active layer of the semiconductor layer sequence of the semiconductor chip includes at least one pn junction and/or at least one quantum well structure in the form of a single quantum well, or SQW, or in the form of a multi-quantum well structure, or MQW. Preferably, the semiconductor chip comprises exactly one contiguous, in particular simply connected, active layer. Alternatively, the active layer may be segmented. The active layer may, for example, generate electromagnetic radiation in the blue or green or red spectral range or in the UV range or in the IR range during intended operation.

The first storage medium is an electronic storage medium, also called a semiconductor memory. In an electronic storage medium, information is stored in or based on electronic (semiconductor) devices. The first storage medium may be implemented by one or more transistors, in particular thin-film transistors, of the optoelectronic component. The first storage medium may be a ROM, EPROM, EEPROM. Preferably, the component comprises an integrated circuit by which the first storage medium is realized.

Preferably, the first storage medium can only be read by wire or cable, that is, by electrically connecting the optoelectronic component. For example, an electrical connection via electrical lines to a control unit or a computer must be established for this purpose and thus the first storage medium can be read out. In particular, the component further comprises a communication interface via which a readout or a write by means of an external component, such as a computer, is enabled.

According to at least one embodiment, a first component information is electronically stored in the first storage medium. The component can be uniquely identified via the first component information. The first component information can be read out electronically. Thus, by establishing an electrical connection to a reader, for example to a computer, the first component information can be acquired.

The first component information is, for example, a serial number or an address, such as a physical address or device address or MAC address. The first component information may be stored in the first storage medium in a rewritable manner (soft coded). Alternatively, the first component information may be partially or completely stored in the first storage medium in a non-rewritable manner (hard coded). For example, the first component information may be partially or completely hard-coded in a metallization of the component, in particular in a metallization of the integrated circuit (IC metallization).

The optoelectronic component is uniquely identifiable via the first component information. Thus, no two different components are assigned the same first component information. Preferably, the optoelectronic component is uniquely identifiable in a signal-technical interconnection with a control unit by means of the first component information. For example, the component can communicate the first component information from the first storage medium to the control unit and/or a component can determine whether the electronic signal is intended for this component by comparing the first component information stored in the component and an address in the control signal when receiving an electronic control signal sent by the control unit. Communication with a control unit preferably takes place via the communication interface.

The first component information is preferably representable by a character string with which at least $1 \cdot 10^6$ or at least $1 \cdot 10^9$ or at least $10 \cdot 10^9$ components can be assigned a biuniquely assigned first component information. The first storage medium preferably comprises a storage capacity of at least 20 bits or at least 3 bytes.

According to at least one embodiment, the optoelectronic component comprises a second storage medium that can be read out wirelessly at least in an unmounted state of the component. The second storage medium differs from the first storage medium with respect to the type of storage medium, preferably also with respect to the position in the component. Thus, the second storage medium is in particular not an electronic storage medium.

"Wireless" also means touchless or contactless or wireless. For example, the second storage medium is readable by induction or by transmission of electromagnetic waves or visually. In particular, the second storage medium is freely viewable by an observer from outside the component, at least as long as the component is not mounted or electrically connected.

According to at least one embodiment, a second component information is stored on the second storage medium. The second component information is representative of the first component information. The second component information can be read out from the component wirelessly. Preferably, the first component information is uniquely extractable from the second component information. That is, the second component information includes the first component information. For example, the second component information is identical to the first component information. However, the first and the second component information may be stored in differently encoded form in the respective storage media.

In addition to the second component information, further component information may be stored or are stored in the second storage medium. For example, information about the brightness or color location of the radiation emitted by the component during intended operation is stored in the second storage medium. Likewise, further information may be stored in the first storage medium.

In at least one embodiment, the optoelectronic component comprises an optoelectronic semiconductor chip and an electronic first storage medium. A first component information is electronically stored in the first storage medium. The component can be uniquely identified via the first component information. The optoelectronic component comprises a second storage medium that can be read out wirelessly at least in an unmounted state of the component. The second storage medium stores second component information that is representative of the first component information.

The present invention is based in particular on the realization that optoelectronic components, such as LEDs, are to be addressed individually in many applications. For this purpose, a control unit must be able to uniquely identify the respective optoelectronic component. This can be solved using the daisy-chain method, in which communication with the control unit and the optoelectronic components is set up serially, i.e. a serial bus is used. In this case, an address is forwarded until the last optoelectronic component no longer reports a connection. In this way, it can be serially determined at which position in the chain the component is located and thus the component can be biuniquely addressed (auto-addressing). A failure of a component in the chain can interrupt the entire communication. This can be disadvantageous in safety-relevant applications, for example in a motor vehicle.

Another possibility is to establish parallel communication between the components and the control unit. To address the components, however, an additional serial conductor path may be required. This may be undesirable since additional space is required.

The present invention provides an optoelectronic component with which a communication structure to a control unit is simplified. The component carries electronically stored, first component information, which ensures unambiguous communication with a control unit. For the communication setup with the control unit, the component comprises a second storage medium with a second component information representative of the first component information. The second storage medium can be read wirelessly. When establishing communication, the second component information and thus the first component information or the address of the component can be communicated to the control unit by simply reading out the second storage medium, for example with the aid of a scanner or a reader. Serial connection of several components is then not necessary. The components can then be coupled purely in parallel with the control unit, for example.

A further advantage is that the simple readability of the second storage medium and the unambiguous identifiability of the component on the basis of the first component information mean that a faulty component can be traced unambiguously and in a simple manner.

According to at least one embodiment, the first storage medium is implemented by an IC-chip (IC=integrated circuit) of the component. That is, the IC-chip comprises the first storage medium or is the first storage medium. The IC-chip is preferably an application-specific integrated circuit, ASIC for short. For example, the IC-chip is configured to control the optoelectronic semiconductor chip.

The first component information can uniquely identify the IC-chip, for example. In the production of IC-chips, a plurality of IC-chips are usually produced in a wafer composite. The first component information may then comprise a wafer number and a position of the IC-chip in the wafer. Alternatively or additionally, the first component information may also include the date and/or time of manufacture of the IC-chip or optoelectronic component.

According to at least one embodiment, the second storage medium is a portion of the component that is freely viewable in the unmounted state of the component. The second component information is contained in an optoelectronically readable character string in the freely viewable section. In particular, the character string containing the second component information is visible with the naked eye. The character string may be a 1D code, for example a bar code, or a 2D code, for example a QR code. Preferably, the character string can only be read or decoded with the aid of a technical appliance. Optoelectronically readable means, in particular, that the character string is readable with a visual reader, such as a scanner.

In other words, the second component information is written to the optoelectronic component in a way that can be perceived visually. A writable section of the component serves as the second storage medium. The second component information may be engraved or lasered or printed on this section. The second storage medium may be an engraved or lasered or printed label, which is permanently fixed in the component.

Alternatively or additionally, the second storage medium may be implemented by an RFID transponder. Thus, the second storage medium is a memory in the RFID transponder. In this case, the second storage medium may be writable at least once.

Thus, the component may also comprise several, second storage media, which are realized in different ways, and which, for example, each carry the same, second component information.

According to at least one embodiment, the optoelectronic component comprises a plurality of optoelectronic semiconductor chips that can be electrically controlled via the IC-chip. Preferably, the optoelectronic semiconductor chips of a component are individually and independently drivable. The individual semiconductor chips of a component may emit radiation of different spectral ranges during operation. For example, each optoelectronic component includes a first semiconductor chip for emitting warm white light and a second semiconductor chip for emitting cool white light. It is also possible for each component to include a first semiconductor chip for emitting red light, a second semiconductor chip for emitting blue light, and a third semiconductor chip for emitting green light. An optoelectronic component then forms an RGB unit.

Alternatively or additionally, the optoelectronic semiconductor chip or an optoelectronic semiconductor chip of the device may be a pixelated semiconductor chip with a plurality of individual pixels. The individual pixels are electrically controllable via the IC-chip, preferably individually and independently controllable. The different pixels of the semiconductor chip are preferably realized by different sections of a coherent semiconductor layer sequence of the semiconductor chip.

According to at least one embodiment, the optoelectronic component comprises a carrier. The carrier may be a leadframe or a ceramic carrier or a printed circuit board, PCB for short. The carrier is a stabilizing component of the component. In particular, the carrier is self-supporting. It is possible that the carrier of the component is formed by the IC-chip.

According to at least one embodiment, the optoelectronic component comprises a radiation impermeable housing with a recess. The housing is arranged on the carrier and is preferably supported by the carrier. For example, the housing may be formed of a plastic, for example a white plastic. The housing is preferably impermeable to radiation emitted from the semiconductor chip. The second component information may be applied to or introduced into the housing, for example, directly embossed or printed or lasered into or onto the housing. Alternatively, a separate label with the second component information may be applied to the housing.

According to at least one embodiment, the optoelectronic semiconductor chip is arranged on the carrier in the region of the recess. In particular, the housing thus does not cover the optoelectronic semiconductor chip as seen in a top view. This allows the radiation emitted by the optoelectronic semiconductor chip to exit the component. The first storage medium and/or the IC-chip may also be arranged on the carrier. Preferably, the first storage medium and/or the IC-chip is covered by the housing and is not visible from the outside to an observer. The IC-chip may be embedded in the housing.

Next, the system is specified.

According to at least one embodiment, the system comprises a plurality of the optoelectronic components described herein.

Further, the system comprises a third storage medium. The optoelectronic components are arranged at different positions in the system, such that each component is biuniquely associated with a position in the system with the associated second component information. With position is meant in particular a spatial position. Position information representative of which second component information is associated with which position is stored in the third storage medium.

For example, the system is intended for use in a vehicle (motor vehicle or rail vehicle or aircraft) or an interior space, such as a workspace or living space. The individual components are then arranged at different positions in the vehicle or the interior space. If a certain component of the system is to be controlled, for example, in order to illuminate a certain region of the vehicle or the interior, the position information can be used to determine which second component information amounts to the component at this position. The second component information can then be used to determine, for example, the first component information/address of the component, so that a corresponding control signal can be output for the component.

According to at least one embodiment, the system comprises a control unit. The control unit and the optoelectronic components are coupled to each other in terms of signals. The control unit is configured for controlling, in particular for selectively controlling, the individual optoelectronic components.

The control unit can therefore communicate with the components, for example directly, without a further intermediate control unit. The control unit can be a so-called gateway and mediate communication between a master control unit and the components. Alternatively, however, the control unit can also be the master control unit, wherein a gateway, for example in the form of a further control unit, is then connected between the control unit and the components. The control unit is a different component of the system from the optoelectronic components. In particular, the control unit is locally separate from the optoelectronic components.

Preferably, the individual optoelectronic components of the system can be controlled in parallel or on an equal basis via the control unit. This can be realized by a parallel bus, which is then part of the system.

According to at least one embodiment, the third storage medium is realized by the control unit of the system. Thus, the third storage medium is an internal memory of the control unit. In particular, the third storage medium is then an electronic storage medium. It is also possible for the system to comprise multiple control units, for example a master control unit and a gateway. The position information may then be stored in several or all control units.

According to at least one embodiment, the system is an optoelectronic module or comprises an optoelectronic module. The module comprises a module carrier, for example a printed circuit board. The optoelectronic components are arranged on different positions of the module carrier. In particular, the optoelectronic components are thus permanently mechanically connected to each other via a common module carrier with fixed specified distances and fixed specified relative positions. The optoelectronic components can be arranged in a specified geometric pattern on the module carrier. The module carrier can be used to implement the signal-technical interconnection of the optoelectronic components with each other and/or with the control unit.

The control unit can be arranged and fixed on the module carrier. Alternatively, it is possible for the control unit to be arranged at a distance from the module carrier, for example with variable spacing. For example, the control unit is connected to the module carrier only via cables.

According to at least one embodiment, the third storage medium can be read out wirelessly. Preferably, the third storage medium is applied to the module carrier or introduced into the module carrier. The third storage medium can be a section of the module that is freely visible in the unmounted state of the module. The position information is then contained, for example, in an optoelectronically readable character string in the freely viewable section of the module, for example in a bar code or a QR code. Alternatively, it is possible that the third storage medium is implemented by an RFID transponder in or on the module carrier. Preferably, the third storage medium is device-connected and/or visual readable.

For example, by simply scanning with a reader, the wirelessly readable third storage medium allows the third storage medium to be read and the position information to be uploaded to the control unit. In the event of damage to the module, the module can be replaced more easily. One scan process is sufficient to upload the position information of the new module to the control unit, possibly overwriting the old position information of the old module.

If the system additionally comprises one or more control units, the position information may be stored in the wirelessly readable third storage medium as well as in one or more control units.

According to at least one embodiment, the module is a display backlight or a headlight or a brake light or a tail light or a display or an interior light. The module is suitable, for example, as a display or display backlight for a tablet or smartphone. The module may be used as a headlight or a taillight or a brake light in a vehicle, for example a motor vehicle or a rail vehicle or an aircraft, or as interior lighting.

Further, a vehicle, in particular a motor vehicle, comprising a system described herein is specified.

Next, the method for producing an optoelectronic component is specified. In particular, the method is used to manufacture an optoelectronic component described herein. All features disclosed in connection with the optoelectronic component are thus also disclosed for the method, and vice versa.

According to at least one embodiment of the method for producing an optoelectronic component, the method comprises steps A1, B1 and C1. In step A1, a base component is provided with an electronic first storage medium. In step B1, a first component information is stored in the first storage medium, wherein the base component is uniquely identifiable via the first component information and wherein the first component information is electronically readable. In step C1, a second storage medium with a second component information is assigned to the base component, wherein the second component information is representative of the first component information and wherein the second storage medium can be read out wirelessly at least in an unmounted state of the finished component.

After performing steps A1, B1, and C1, the optoelectronic component is or will be produced from the base component.

Steps A1, B1, C1 can be carried out one after the other in the order indicated. Alternatively, however, it is also conceivable that step A1 is carried out first, then step C1 and then step B1.

If step B1 is performed before step C1, the first storage medium is preferably read out between steps B1 and C1 and the first component information is extracted. Depending on the first component information, the second component information is then determined and stored accordingly in the second storage medium.

If step C1 is executed before step B1, the second storage medium is preferably read out between steps C1 and B1 and the second component information is extracted in the process. Depending on the second component information, the first component information is then stored on the first storage medium.

Storing the first component information on the first storage medium is performed electronically, for example by connecting the base component to a computer. Storing the second component information may be done by engraving, for example by means of a laser, or printing a character string on the base component or on a label, which is subsequently applied to the base component.

In step A1, the base component may already comprise all physical components of the finished optoelectronic component, such as the optoelectronic semiconductor chip, the IC-chip, the housing, and the carrier. However, in step A1, the basic component may initially comprise only the IC-chip, possibly together with the housing and/or the carrier. The optoelectronic semiconductor chip is then applied, for example, only after steps A1, B1 and C1.

Next, the method for producing a system is specified. The method is particularly suitable for producing the system described herein. All features disclosed in connection with the system are therefore also disclosed for the method for producing the system, and vice versa.

According to at least one embodiment, the method comprises steps A2, B2 and C2. In step A2, a plurality of optoelectronic components is provided. A component information is stored in each of the components, wherein each component is uniquely identifiable by the associated component information. In step B2, the components are arranged at different positions, in particular different spatial positions, so that a position is biuniquely assigned to each component with the associated component information. In step C2, the component information of the components is acquired and position information is stored in a third storage medium. The position information is representative of which component information is assigned to which position.

Steps A2 to C2 are preferably performed one after another and in the specified order. The component information of each component may be acquired sequentially or simultaneously.

The optoelectronic components provided in step A2 are preferably each an optoelectronic component as previously described. The components provided in step A2 may each be produced prior to step A2 with the method for producing an optoelectronic component described previously.

Different functions may be assigned to the different positions at which the components are placed. The different positions may be different positions on a module carrier or different positions in a vehicle or different positions in an interior.

The position information is determined in step C2 depending on the component information and the positions occupied with components. For example, position identifiers are biuniquely assigned to the individual positions. The position identifiers are sorted in a specified order, for example. In step C2, the components can be read/scanned one after the other according to the specified sequence of position identifiers in order to record the respective component information. This enables a biunique assignment of the captured component information to the position identifiers and thus to the positions. The component information is preferably recorded with the aid of a reader, in particular a visual reader.

According to at least one embodiment, the position information is stored in a control unit in step C2. The control unit is configured to control the individual components.

According to at least one embodiment, the system comprises a module or is a module. The module comprises a module carrier. In step B2, the optoelectronic components are arranged on different positions of the module carrier, for example in a specified pattern.

According to at least one embodiment, the third storage medium is wirelessly readable. For example, the third storage medium is a label or a section of the module carrier. In step C2, for example, a character string containing the position information is printed or imprinted, in particular with a laser. The character string may be applied to the section of the module carrier or label. For example, the character string is a 1D code or a 2D code. Subsequently, the label can be attached to the module carrier.

Alternatively, it is conceivable that an RFID transponder is written in step C2 and this is/will be applied or introduced as the third storage medium on the module carrier.

According to at least one embodiment, in step C2 of the method for producing the system, the second component information is determined in each case, in particular by contactless reading.

Next, the method for driving a system is specified. In particular, a system described herein is controlled. All features disclosed in connection with the system are therefore also disclosed for the method for driving a system, and vice versa.

According to at least one embodiment, in the method for controlling a system, first of all a control information is provided which is representative of the position of the system at which an optoelectronic component placed there is to be controlled. Subsequently, depending on the position information stored in the third storage medium, the second component information is determined which is assigned to the component to be controlled. The optoelectronic component to which the previously determined second component information is assigned is then controlled.

During controlling, for example, a control signal is provided by a control unit and transmitted in parallel to all optoelectronic components of the system. The control signal contains an address corresponding to the second component information or to the associated first component information of the component to be controlled. When the control signal reaches the optoelectronic components, it can be compared in each optoelectronic component whether the address contained in the control signal corresponds with the first component information stored in the component. Only if this is the case, the component is controlled according to the control signal.

What has been said so far concerned an optoelectronic component or a system with optoelectronic components or a method for producing an optoelectronic component or a method for producing and controlling a system with optoelectronic components. However, the concepts described so far can also be applied to electronic components in general, such as sensors or actuators in particular. All features disclosed for the optoelectronic component and the method for producing an optoelectronic component are therefore disclosed for an electronic component and a method for producing an electronic component. For example, except for an optoelectronic semiconductor chip, an electronic component comprises the same features as the optoelectronic component. The features disclosed for the system and methods for producing/controlling a system are also disclosed for a system and method for producing/controlling a system in which electronic components are used instead of or in addition to the optoelectronic components.

In the following, an optoelectronic component described herein, a system described herein, a method for producing a system described herein, and a method for producing an optoelectronic component described herein are explained in more detail with reference to drawings based on exemplary embodiments. Identical reference signs thereby specify identical elements in the individual figures. However, no references to scale are shown; rather, individual elements may be shown exaggeratedly large for better understanding.

Showing in:

FIGS. 1A to 2B exemplary embodiments of an optoelectronic component in cross-sectional view and top view, FIGS. 3 to 7 various exemplary embodiments of the system, FIGS. 8A to 8C positions in an exemplary embodiment of the method for producing a system FIGS. 9A to 10C positions in exemplary embodiments of the method for producing an optoelectronic component.

Figure 1A:
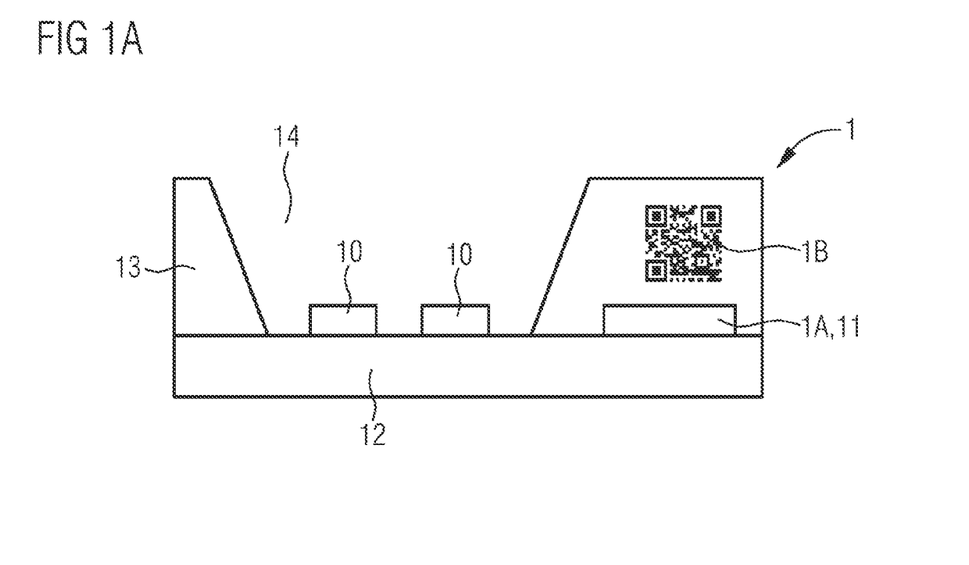
Figure 1B:
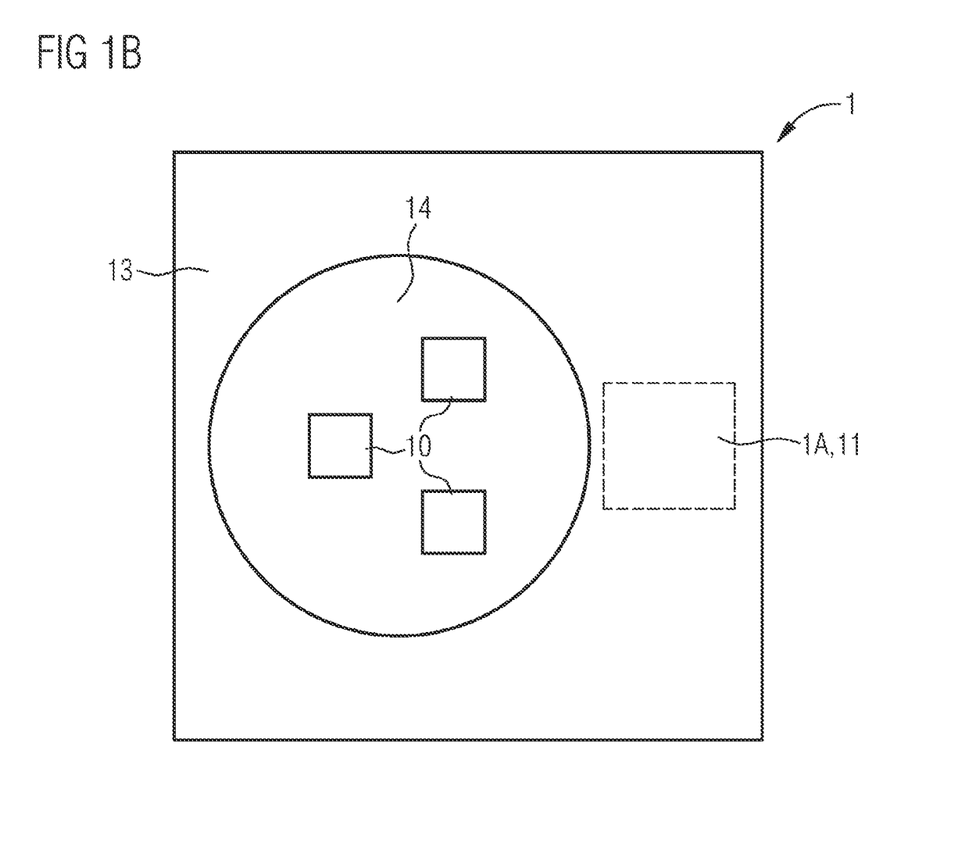

In FIGS. 1A and 1B, a first exemplary embodiment of the optoelectronic component 1 is shown in cross-sectional view (FIG. 1A) and in plan view (FIG. 1B). In the present case, the optoelectronic component 1 is an LED. The optoelectronic component 1 comprises a plurality of optoelectronic semiconductor chips 10 which are applied to a common carrier 12. The carrier 12 is, for example, a ceramic carrier or a leadframe. In operation, the optoelectronic semiconductor chips 10 emit, for example, visible light of different spectral ranges, such as red light, blue light, and green light.

Furthermore, the optoelectronic component 1 comprises an IC-chip 11, for example an ASIC. The IC-chip 11 is arranged next to the semiconductor chips 10 on the carrier 12. Alternatively, it would also be conceivable that the IC-chip itself forms the carrier 12 on which the semiconductor chips 10 are arranged. Via the IC-chip 11, the three semiconductor chips 10 are individually and independently controlled during operation. The IC-chip 11 includes an electronic first storage medium 1A. The first storage medium 1A stores first component information by which the component 1 can be uniquely identified. The first component information is, for example, a serial number or an address of the component. The first component information can be read out electronically from the first storage medium 1A, preferably by electrically connecting a reader.

The optoelectronic component 1 further comprises a radiation-impermeable housing 13, for example a white plastic housing 13. A character string in the form of a QR code is printed on or embossed in a portion of the housing 13. In the present embodiment, the section with the character string forms a second storage medium 1B. The QR code includes a second component information. The second component information is representative of the first component information. In particular, the second component information corresponds to the first component information.

As can be seen in FIG. 1, the semiconductor chips 10 are arranged in a recess 14 of the housing 13 on the carrier 12 so that the radiation emitted from each of the semiconductor chips 10 in operation can exit the component 1. The IC-chip 11 is covered by the housing 13.

Figure 2A:
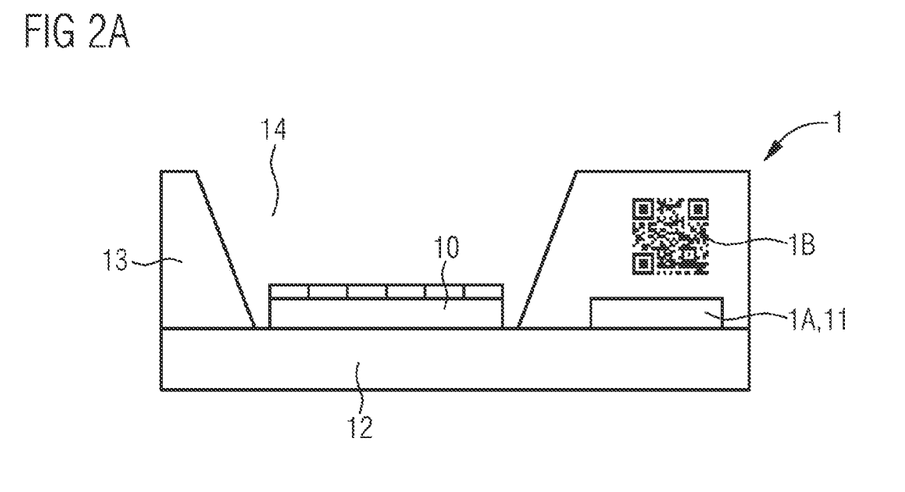
Figure 2B:
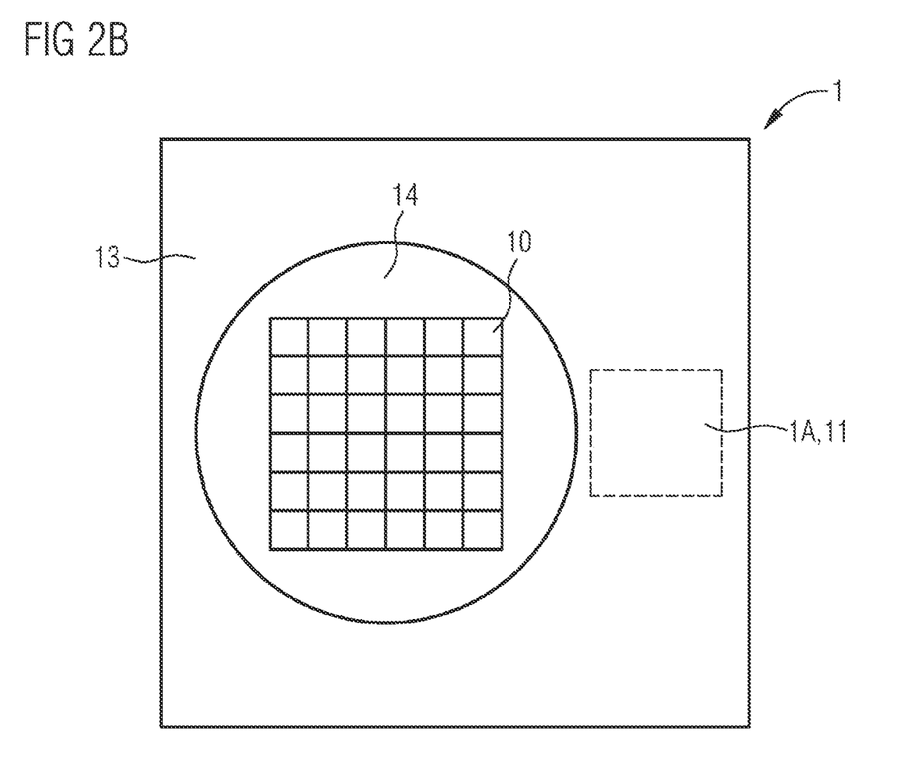

In FIG. 2, a second exemplary embodiment of the optoelectronic component 1 is again shown in cross-sectional view (FIG. 2A) and plan view (FIG. 2B). Unlike the exemplary embodiment of FIG. 1, the component 1 here comprises only a single semiconductor chip 10 arranged in the recess 14 of the housing 13. The semiconductor chip 10 in the present case is a pixelated semiconductor chip with a plurality of pixels. In operation, the pixels can be controlled individually and independently of one another via the IC-chip 11.

Figure 3:
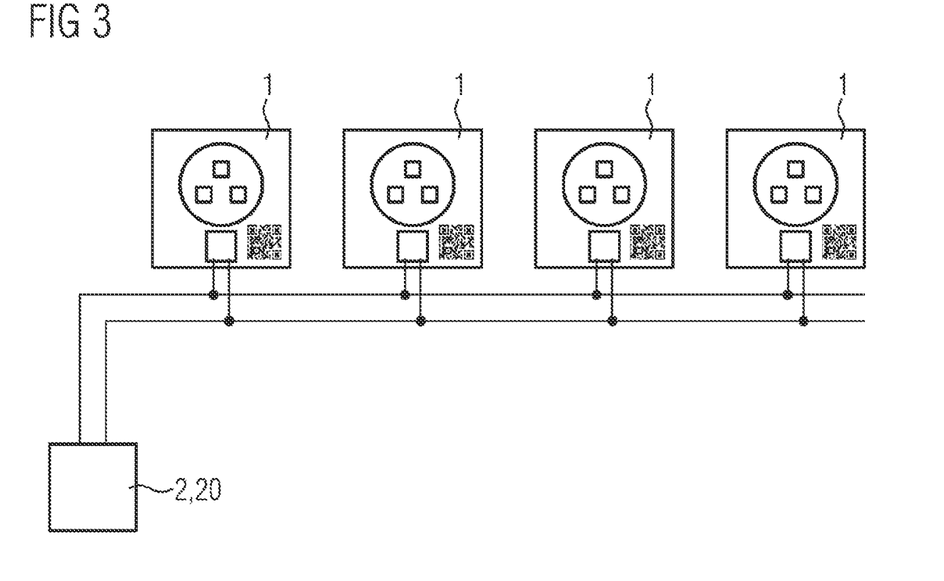

FIG. 3 shows a first exemplary embodiment of the system. The system comprises a plurality of optoelectronic components 1, each of which may be adapted as shown in FIG. 1 or FIG. 2. Further, the system comprises a control unit 20 comprising a third storage medium 2. The components 1 are signal-technically coupled with the control unit 20. This is achieved in the present case by means of a bus via which the components 1 are connected in parallel with the control unit 20. Thus, during operation of the system, the components 1 are supplied equally (in parallel) with a control signal output by the control unit 2.

FIG. 3 shows that the components 1 are arranged at different positions. This is a component chain in which the components are arranged at different positions in the chain. Each optoelectronic component 1 of the chain with the associated second component information is therefore biuniquely assigned a position in the chain. In the third storage medium 2, position information is stored which is representative of which second component information is assigned to which position in the chain. Thus, at least indirectly, the first component information or the address of each component is associated with the position assigned to the component.

During operation of the system, drive information can be provided that is representative of the position at which an optoelectronic component placed there is to be controlled. For example, the penultimate component of the chain is to be driven. Depending on the position information stored in the third storage medium 2, it can be determined which second component information the component to be controlled has. By transmitting a corresponding control signal with the appropriate second component information/first component information/address, the penultimate component 1 of the chain can be selectively controlled.

Figure 4:
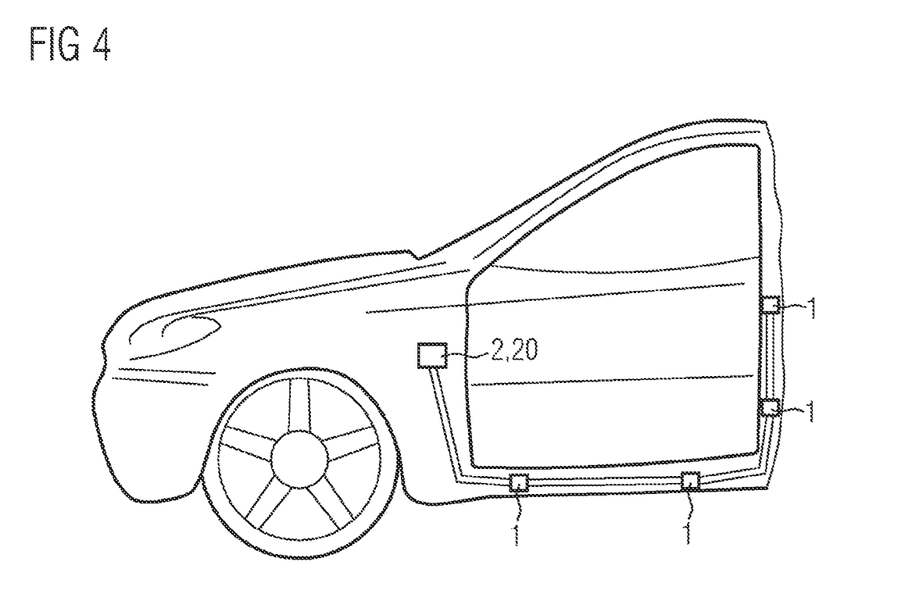

In FIG. 4, a vehicle is shown with a system. The system corresponds, for example, to the system shown in FIG. 3. The chain of components 1 is installed in a door frame of the vehicle. During operation of the system, individual regions of the door frame can then be selectively controlled/illuminated.

Figure 5:
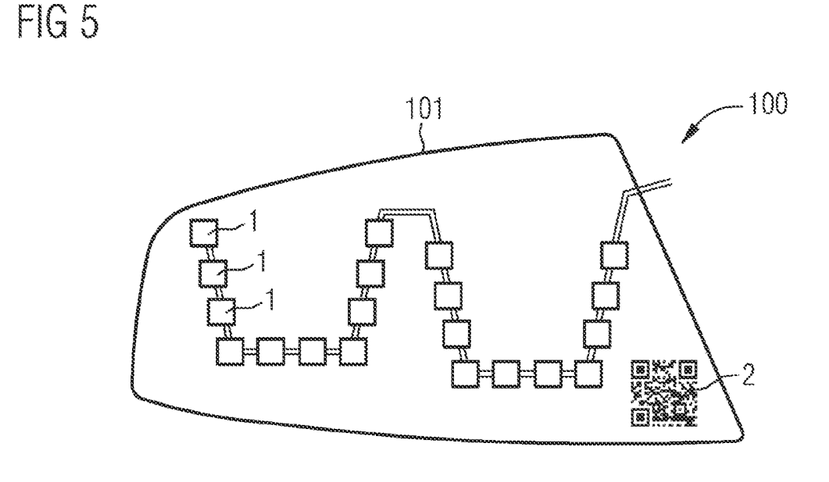

FIG. 5 shows another exemplary embodiment of the system. In the present case, the system is a module 100. The module 100 is, for example, a tail light for a motor vehicle. The module comprises a module carrier 101. A plurality of optoelectronic components 1, for example as described in connection with FIG. 1 or 2, are mounted in a specified pattern on the module carrier 101. The components 1 are in turn connected in parallel with a signal line/bus leading to a control unit (the control unit is not shown). On the module carrier 101, which is for example a printed circuit board, the third storage medium 2 is implemented by a printed or embossed QR code in which the position information of the module 100 is stored. When the module 100 is installed, for example in a vehicle, the third storage medium 2 can be read, for example with the aid of a scanner, and the position information can be uploaded to a control unit. In this way, selective control of the individual components 1 of the module 100 is made possible via the control unit.

Figure 6:
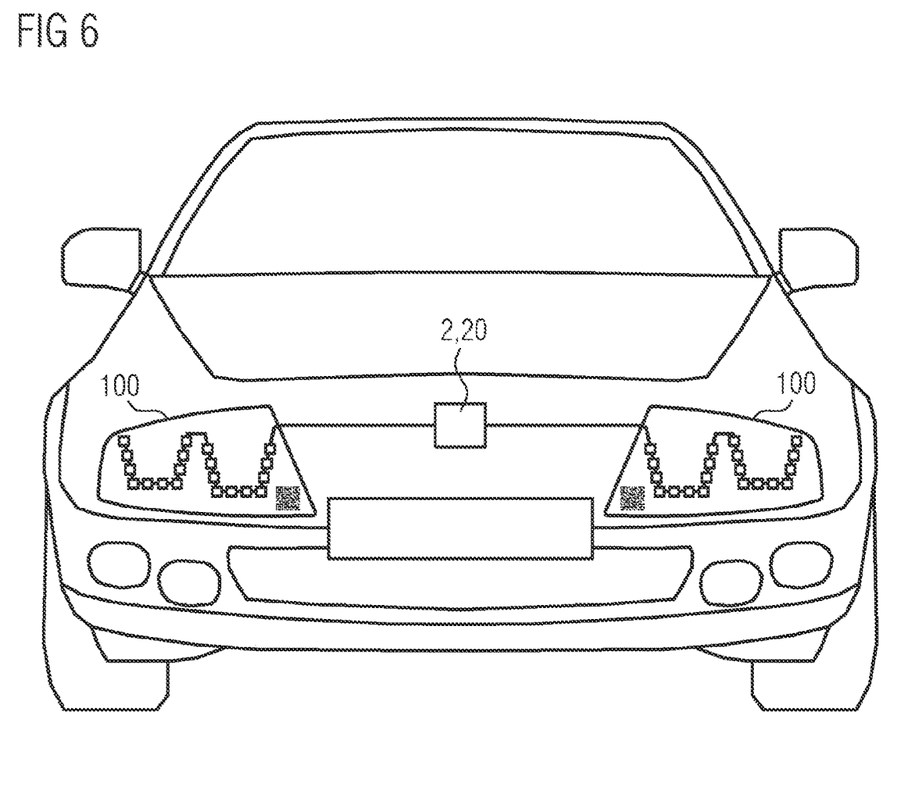

FIG. 6 shows a further exemplary embodiment of the system, which is installed in a vehicle, for example. Here, the system comprises two modules 100, as described, for example, in connection with FIG. 5. Furthermore, the system comprises a control unit 20, via which the modules 100 can be controlled. The position information of the individual modules 100 is stored in a respective QR code of the modules 100. When the modules 100 are installed, a reader can be used to read the QR code in each case, and the extracted position information can be uploaded to the control unit 2 or to the third storage medium 20 of the control unit 2. Thus, the position information is stored in both the QR codes and the control unit 2. If one of the modules 100 is defective, it can be easily replaced, and the respective position information of the new module 100 can be quickly and easily uploaded to the control unit 2 using a reader, overwriting the old position information.

Figure 7:
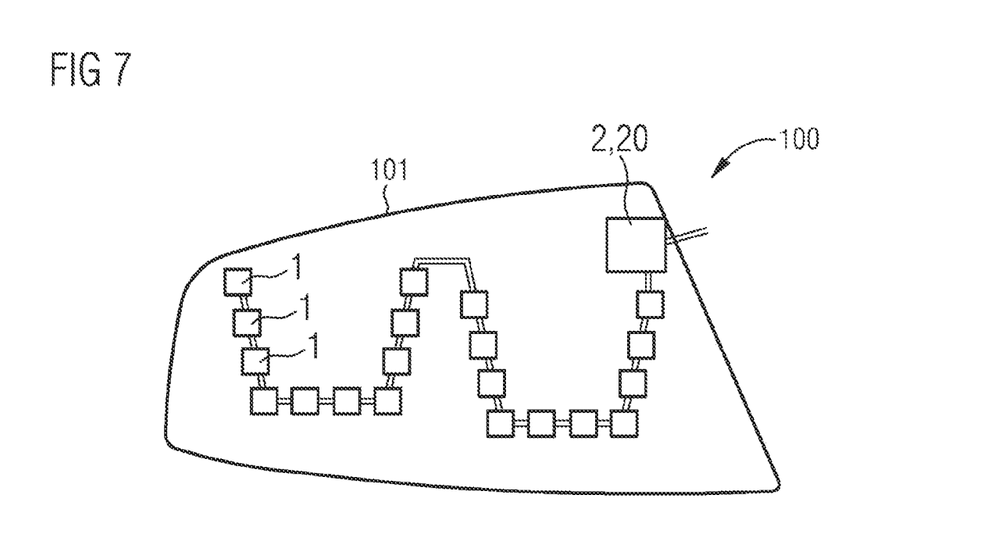

FIG. 7 shows another exemplary embodiment of the system. Again, the system comprises a module 100, for example in the form of a tail light. Unlike in FIG. 5, the third storage medium of the module 100 is now not implemented as an optically readable code, but by a control unit 20 biuniquely assigned to the module 100. The control unit 20 is arranged on the module carrier 101. The control unit 20 is, for example, a gateway. The control unit 20 on the module is controlled in operation, for example, by a master control unit.

Figure 8A:
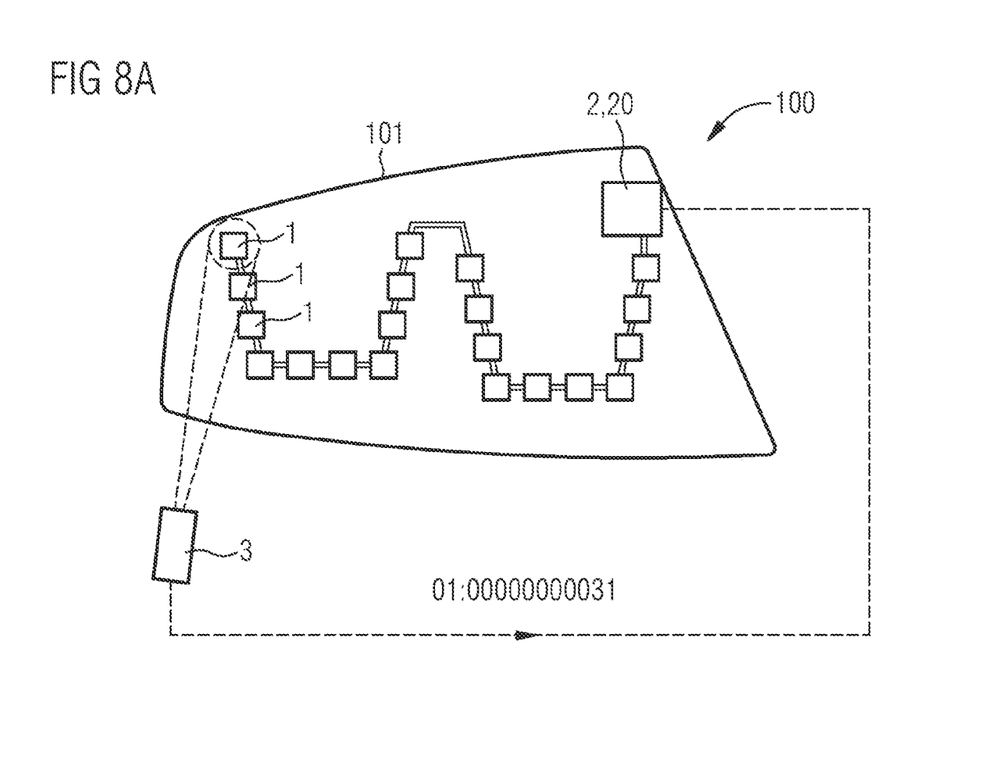
Figure 8B:
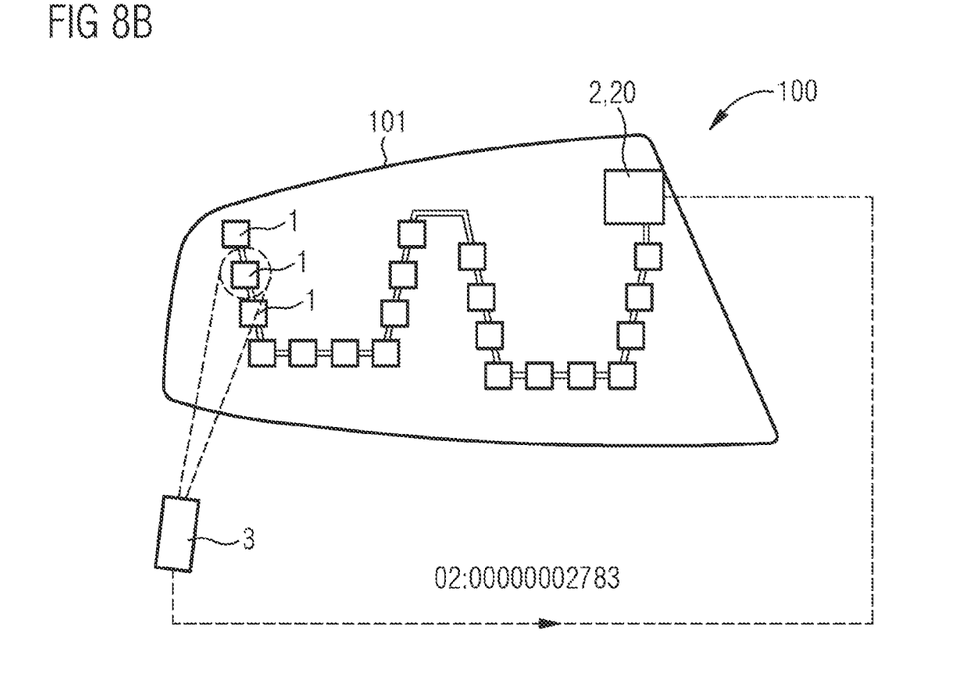
Figure 8C:
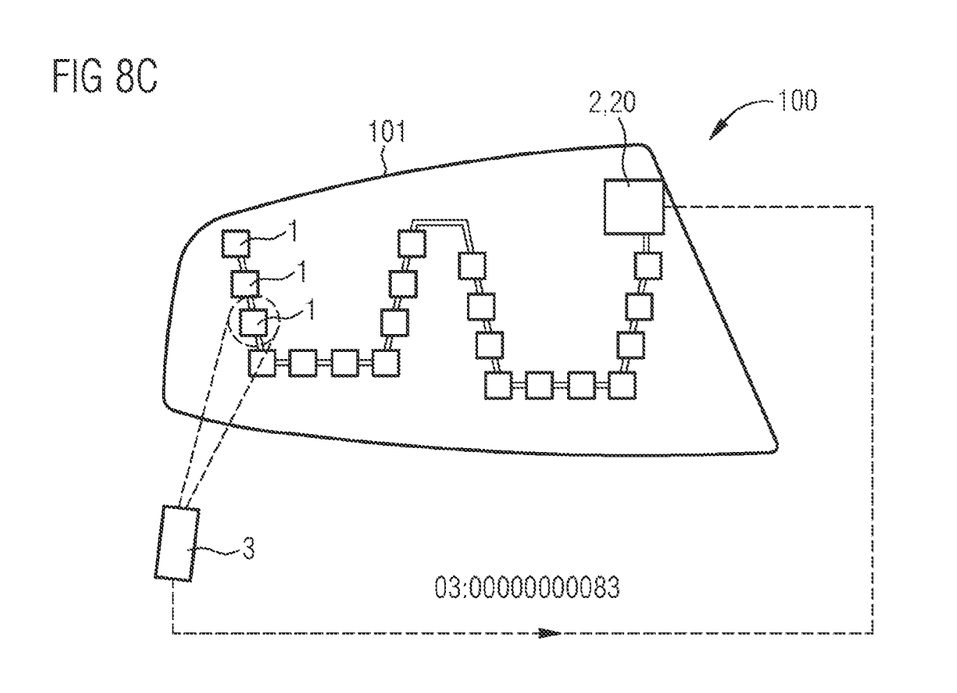

FIG. 8 shows an exemplary embodiment of the method for producing the system. For manufacturing, optoelectronic components 1 were first provided in a step A2, each of which is adapted, for example, as the optoelectronic components of FIG. 1 or 2. These components 1 were then arranged at different positions on the module carrier 101 in a step B2. As a result, a position was biuniquely assigned to each component 1 with the associated first and second component information. The next step C2 is now to acquire the second component information of each component 1 and, in dependence thereon, store position information representative of which second component information is associated with which position on the module carrier 101. This position information is stored in the third storage medium 2. In the present case, the third storage medium 2 is again implemented by a control unit 20 on the module carrier 101.

A reader 3, in this case in the form of a scanner, is used to record the component information. With the reader 3, the QR code of the component 1 is first scanned at the first position of the component chain. The first position is assigned, by way of example, the position identifier 01, which is thus stored in the third storage medium 2. The second component information, which is detected by means of the reader 3, is 00000000031 by way of example (FIG. 8A). Accordingly, position information is stored on the third storage medium 2 that the second component information 00000000031 is assigned to the position identifier 01. Subsequently, the component 1 is scanned at the second position (position identifier 02) of the chain (FIG. 8B). The detected second component information 00000002783 is assigned to the position identifier 02 and this position information is stored on the third storage medium 2. Then the component 1 is scanned at the third position of the chain (position identifier 03) (FIG. 8C). The second component information 00000000083 detected in this process is assigned to the position identifier 03 and this position information is stored on the third storage medium 2. This is preferably continued until all components 1 have been scanned. The position information can be stored directly on the third storage medium, or it can be stored temporarily beforehand.

Subsequently, via the control unit 20, the component 1 at the third position of the chain can be controlled, for example, by sending out a control signal that carries the address 00000000083. The components 1 can all be connected in parallel with the control unit 20 so that the control signal reaches all components 1 equally. By comparing the address in the control signal with the first component informations stored electronically in each of the components 1, only the component 1 at the third position in the chain responds to the control signal and emits radiation. All other components 1 remain unchanged or switched off.

Figure 9A:
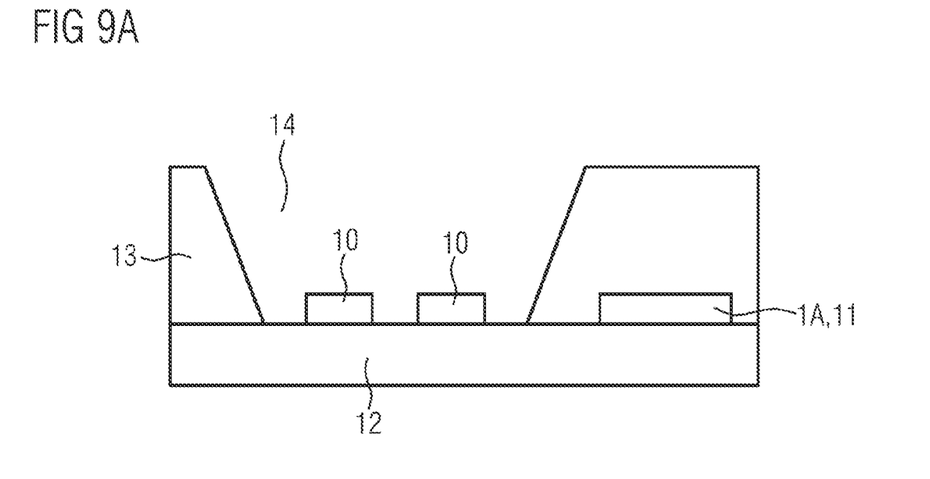

FIG. 9 shows a first exemplary embodiment of the method for producing an optoelectronic component. In the first position of FIG. 9A, a base component is provided (step A1 of the method). The base component includes a carrier 12, optoelectronic semiconductor chips 10 arranged thereon, a housing 13, and an IC-chip 11. The IC-chip 11 further includes an electronic first storage medium 1A. On the first storage medium 1A, a first component information is or will be stored in the position of the FIG. 9A (step B1 of the method). Alternatively, however, it is also conceivable that the first storage medium 1A is implemented by a component of the component that is separate from the IC-chip 11.

Figure 9B:
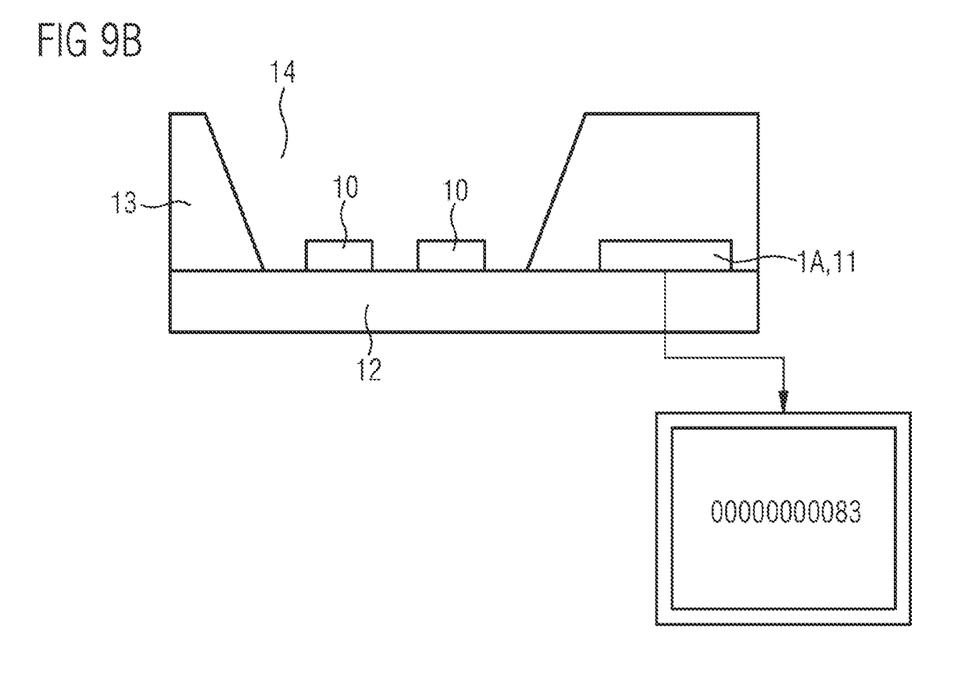

In FIG. 9B a second position of the method is shown, in which the first component information is read out from the first storage medium 1A. For this purpose, a reader 3, for example in the form of a computer, is connected to a communication interface of the basic component. The first component information is communicated to the computer and is in this case the digit 00000000083.

Figure 9C:
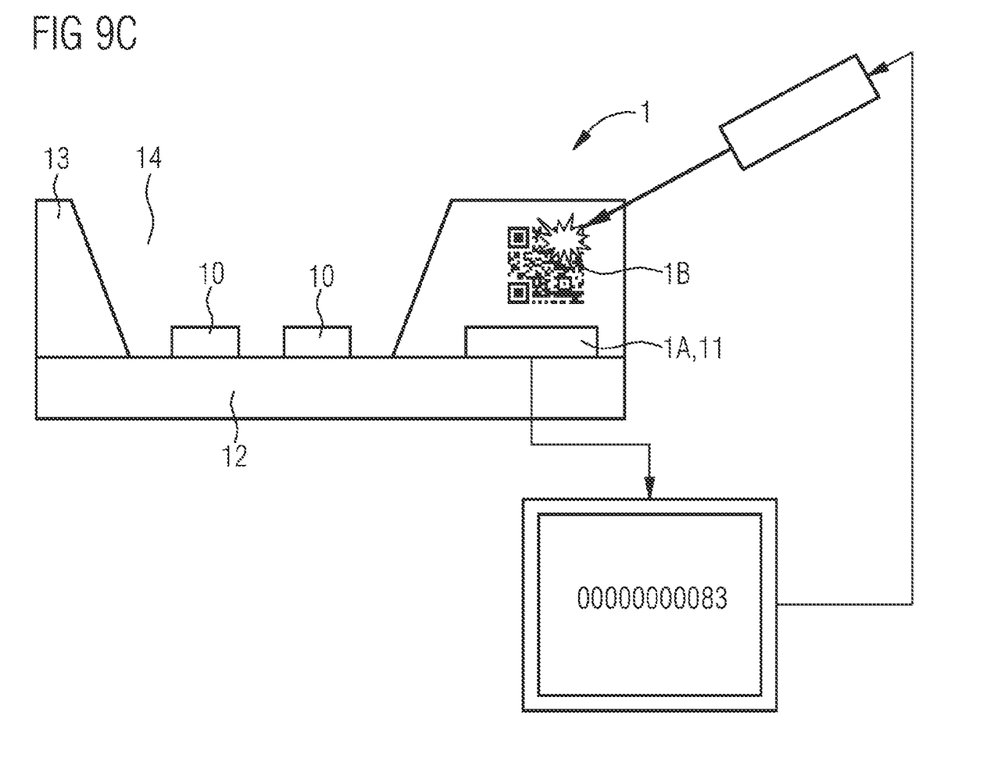

FIG. 9C shows a third position of the method (step C1) in which, depending on the read-out first component information, a second storage medium 1B on which a second component information is stored is assigned to the base component. In this case, a QR code is inscribed in the housing 13 with the aid of a laser, wherein the second component information is included in the QR code. The second component information is representative of the first component information. In addition, other component information, such as brightness values or color locations, may be stored in the QR code. By writing the QR code, the optoelectronic component 1 is completed.

Figure 10A:
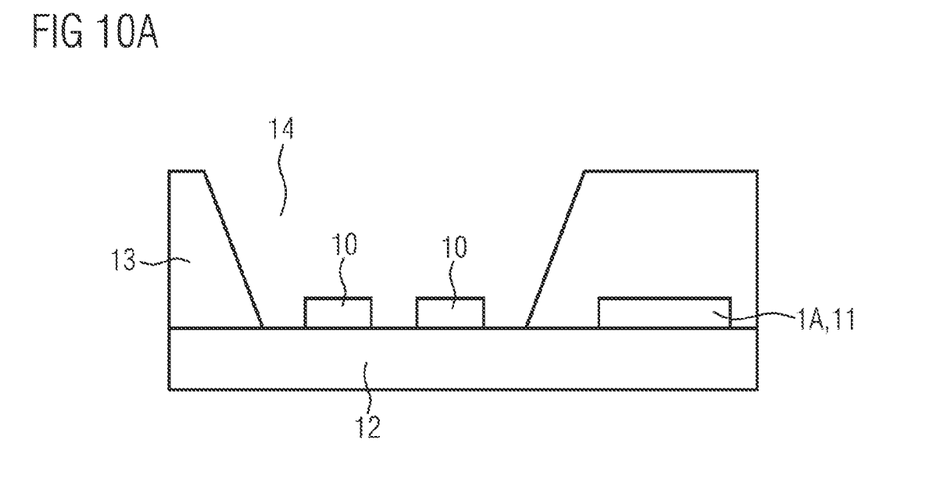
Figure 10B:
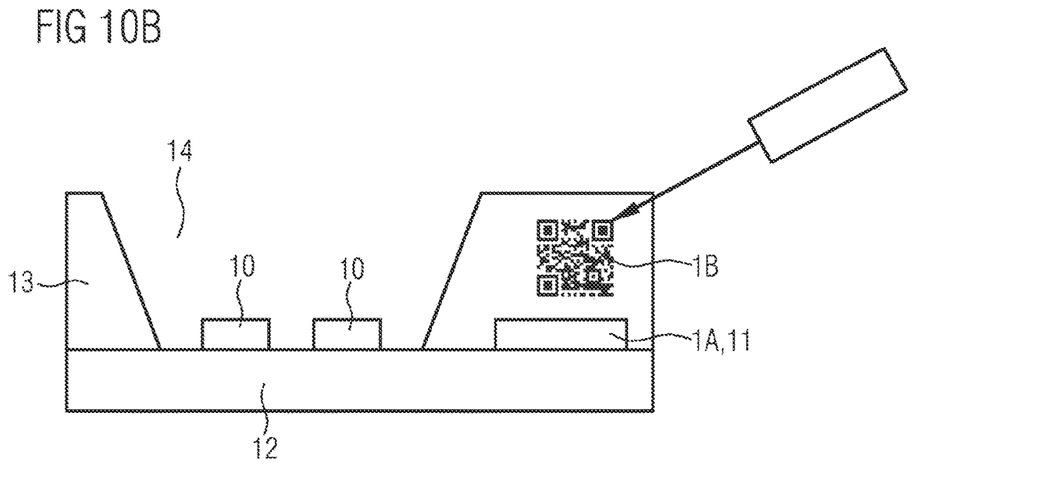
Figure 10C:
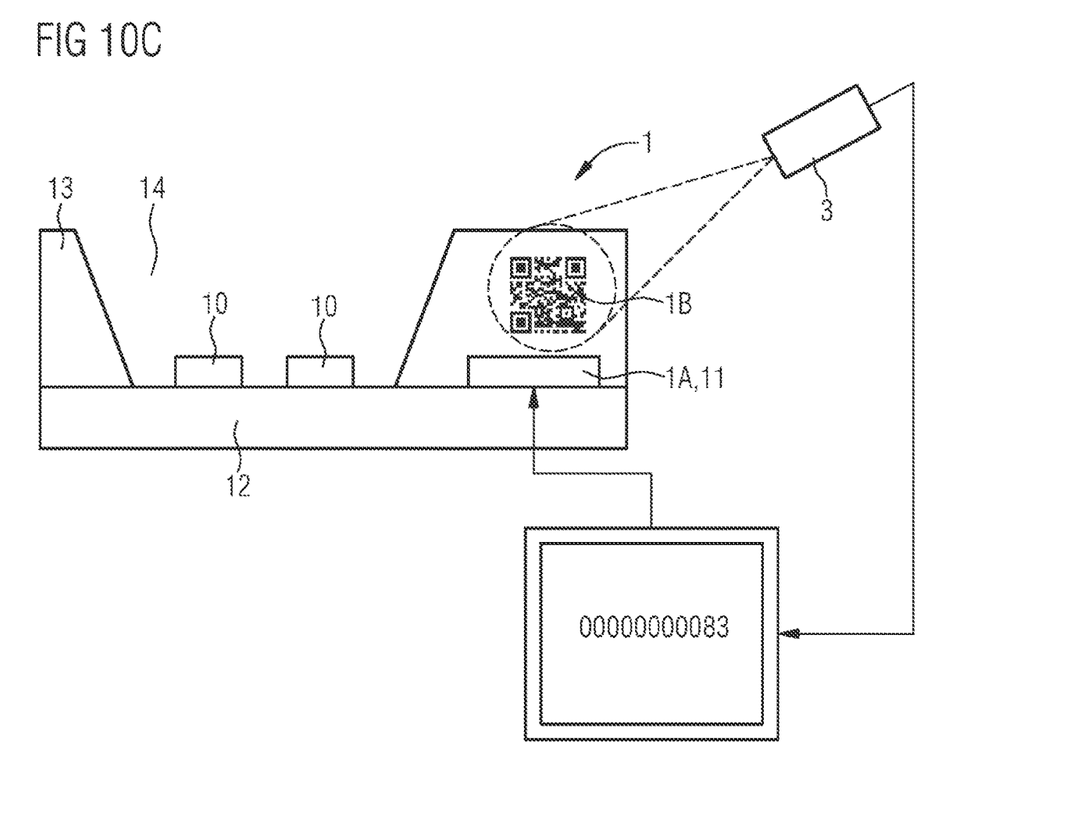

FIG. 10 shows a second exemplary embodiment of the method for producing an optoelectronic component. Here, the method steps B1 and C1 are carried out in reverse order. First, in FIG. 10A, a base component is provided (step A1). Then, a QR code is written into the housing 13 by means of a laser, wherein the QR code contains second component information (step C1). Thereafter, as shown in FIG. 10C, the QR code is read using a reader 3. Accordingly, first component information is then electronically written to the first storage medium 1A of the base component (step B1). Again, the second component information is representative of the first component information.

Instead of a QR code, as shown in FIGS. 9 and 10, the second storage medium 1B may be an RFID transponder which is written with the second component information before or after the first storage medium 1A.

The invention is not limited to the exemplary embodiments by the description thereof. Rather, the invention encompasses any new feature as well as any combination of features, which in particular includes any combination of features in the patent claims, even if these features or this combination itself is not explicitly specified in the patent claims or exemplary embodiments.

LIST OF REFERENCE SIGNS 1 optoelectronic component
1A first storage medium
1B second storage medium
2 third storage medium
3 reader
10 optoelectronic semiconductor chip
11 IC-chip
12 carrier
13 housing
14 recess
20 control unit
100 Module
101 Module carrier

The invention claimed is:

1. A system comprising
a plurality of optoelectronic components, each optoelectronic component of the plurality of optoelectronic components comprising at least one optoelectronic semiconductor chip and a first storage medium, wherein
the first storage medium electronically stores first component information by means of which the optoelectronic component can be uniquely identified,
the optoelectronic component comprises a second storage medium which can be read out wirelessly at least in an unmounted state of the optoelectronic component, and
in the second storage medium a second component information is stored which is representative of the first component information; and
a third storage medium, wherein
the optoelectronic components are arranged at different positions in the system, so that each optoelectronic component of the plurality of optoelectronic components is biuniquely assigned to a position with the assigned second component information,
position information is stored in the third storage medium which is representative of which second component information is assigned to which position.

2. The system according to claim 1, wherein
the system comprises a control unit,
the control unit and the optoelectronic components are coupled to one another in terms of signals,
the control unit is configured to control the optoelectronic components of the plurality of optoelectronic components.

3. The system according to claim 2,
wherein the third storage medium is implemented by the control unit of the system.

4. The system according to claim 1,
wherein the system is or comprises an optoelectronic module, wherein
the module comprises a module carrier,
the optoelectronic components are arranged on different positions of the module carrier.

5. The system according to claim 4,
wherein the third storage medium is wirelessly readable and is applied to the module carrier or introduced into the module carrier.

6. The system according to claim 4,
wherein the module is a display backlight or a headlight or a tail light or a brake light or a display or an interior light.

7. A vehicle comprising a system according to claim 1.

8. A method for producing a system according to claim 1, the method comprising the steps of:
A2) providing a plurality of optoelectronic components each with associated component information stored in each optoelectronic component of the plurality of optoelectronic components, wherein each optoelectronic component of the plurality of optoelectronic components is uniquely identifiable via the associated component information,
B2) assembly of the optoelectronic components of the plurality of optoelectronic components at different positions such that a position is biuniquely assigned to each optoelectronic component of the plurality of optoelectronic components with the associated component information,
C2) recording the associated component information of the optoelectronic components of the plurality of optoelectronic components and storing position information, which is representative of which component information is assigned to which position, in a third storage medium.

9. The method according to claim 8,
wherein the position information is stored in a control unit and the control unit is configured to control the individual components.

10. The method according to claim 8, wherein
the system is a module or comprises a module,
the module comprises a module carrier,
the optoelectronic components of the plurality of optoelectronic components are arranged on different positions of the module carrier in step B2),
the storage medium can be read out wirelessly.

11. The method according to claim 8,
wherein the optoelectronic components of the plurality of optoelectronic components are optoelectronic components according claim 1.

12. The method according to claim 11,
wherein in step C2) the component information of each component is acquired sequentially or simultaneously.

13. A method for controlling a system according to claim 1, the method comprising the steps:
providing control information that is representative of the position of the system at which an optoelectronic component placed there is to be controlled,
determining the second component information associated with the optoelectronic component to be controlled as a function of the position information stored in the third storage medium,
controlling the optoelectronic component to which the second component information is assigned.

* * * * *